US012679287B2

(12) United States Patent
Seo

(10) Patent No.: US 12,679,287 B2
(45) Date of Patent: Jul. 14, 2026

(54) DISPLAY DEVICE AND VEHICLE INCLUDING THE SAME

(71) Applicant: HYUNDAI MOBIS CO., LTD., Seoul (KR)

(72) Inventor: Jun Seong Seo, Yongin-Si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 191 days.

(21) Appl. No.: 18/434,088

(22) Filed: Feb. 6, 2024

(65) Prior Publication Data

US 2025/0026280 A1 Jan. 23, 2025

(30) Foreign Application Priority Data

Jul. 19, 2023 (KR) ........................ 10-2023-0093827

(51) Int. Cl.
B60R 11/02 (2006.01)
B60R 11/00 (2006.01)
H05K 1/18 (2026.01)

(52) U.S. Cl.
CPC ............ B60R 11/0235 (2013.01); H05K 1/18 (2013.01); B60R 2011/005 (2013.01); H05K 2201/10128 (2013.01)

(58) Field of Classification Search
CPC . B60R 11/0235; B60R 2011/005; H05K 1/18; H05K 2201/10128; H05K 9/0007; H05K 9/0204; B60K 35/50; B60K 2360/816; B60K 35/00; B60K 2360/691; B60K 2360/693; B60K 35/60
See application file for complete search history.

(56) References Cited

U.S. PATENT DOCUMENTS

| | | | | |
|---|---|---|---|---|
| 2008/0204987 A1* | 8/2008 | Sakata | ..................... | H05K 5/02 |
| | | | | 361/679.01 |
| 2010/0328862 A1* | 12/2010 | Wang | ................ | G02F 1/133308 |
| | | | | 361/679.01 |
| 2019/0008056 A1* | 1/2019 | Krell | ..................... | B60K 35/60 |
| 2020/0018514 A1* | 1/2020 | Howe | ..................... | F24F 11/52 |
| 2021/0202881 A1* | 7/2021 | Kwon | ................ | H10K 59/8794 |
| 2021/0329802 A1* | 10/2021 | Kim | ................. | G02F 1/133308 |
| 2021/0398955 A1* | 12/2021 | Liu | ..................... | H10D 86/411 |
| 2023/0247851 A1* | 8/2023 | Nakanishi | .............. | H10K 50/84 |
| | | | | 361/679.27 |

* cited by examiner

*Primary Examiner* — Allen L Parker
*Assistant Examiner* — Peter Krim
(74) *Attorney, Agent, or Firm* — NovoTechIP International PLLC

(57) ABSTRACT

A display device mounted in a vehicle includes a display panel; a fixing plate configured to surround side and back surfaces of the display panel and formed to have an opening; a printed circuit board connected to the display panel and disposed in the opening; and a back cover configured to cover the fixing plate and the printed circuit board and configured to include a high-strength composite material. The back cover includes a plurality of slits spaced apart from each other in a first direction at a front surface of the back cover. Thus, the display device forms a plurality of slits in the back cover formed of a high-strength composite material, prevents bending caused by deformation of the back cover, and thus blocks light leakage.

10 Claims, 11 Drawing Sheets

(a)

(b)

(a)

(b)

(a)

(b)

(c)

DISPLAY DEVICE AND VEHICLE INCLUDING THE SAME

CROSS-REFERENCE TO RELATED APPLICATIONS

This application claims the benefit of Korean Patent Application No. 10-2023-0093827, filed on Jul. 19, 2023, which is hereby incorporated by reference as if fully set forth herein.

TECHNICAL FIELD

The present disclosure relates to a display device that blocks light leakage by preventing bending caused by deformation of a back cover made of a high-strength composite material, and thus secures rigidity thereof while reducing thickness thereof, and a vehicle including the display device.

BACKGROUND

A center fascia display of a vehicle may display various visual information about the vehicle. Such a display device may also be installed on a dashboard of a vehicle disposed in front of a driver's seat and a front passenger seat, and provides various convenience information such as navigation, vehicle management and operation, Internet, and entertainment.

A display device processes a signal via a printed circuit board (PCB) located on a rear surface of a display panel to display an image.

Generally, an electronic device emits electromagnetic waves between electronic components mounted on the printed circuit board, causing an electromagnetic interference (EMI). The EMI causes malfunction of the electronic device or has a negative impact on a human body. In particular, as an operating frequency of the electronic device increases to be within a range of tens of Mhz to several Ghz, the EMI problems are becoming more serious.

EMI noise refers to noise that causes noise problems resulted from the interference when the electromagnetic wave generated from one electronic circuit, element, or component is transmitted to another circuit, element, or component.

Therefore, even a display device mounted in a vehicle requires means to solve the above-mentioned EMI noise problems.

In addition, the display device mounted in the vehicle has recently become larger in size, and accordingly, there is a need for means to reduce a thickness of the display device while simultaneously securing rigidity thereof.

However, when only the material of the back cover is changed to ensure the rigidity of the display device, bending caused by deformation during cooling will occur due to characteristics of injection molding, resulting in an error in dimensions required to mount the back cover on the display device.

Although the back cover is mounted on the display device, the back cover may be deformed due to external force applied to the display device.

As a result, such deformation of the back cover may cause a gap to form in a coupling portion of the display device, and may also cause damage to the display device.

Accordingly, an evolved display device that can solve the above-mentioned problems needs to be developed.

SUMMARY

Accordingly, embodiments of the present disclosure are directed to a display device and a vehicle including the same that substantially obviate one or more problems due to limitations and disadvantages of the related art.

The present disclosure provides a display device and a vehicle including the same, and more particularly to a display device that forms a plurality of slits in a back cover formed of a high-strength composite material, prevents bending caused by deformation of a back cover, and thus blocks light leakage, and a vehicle including the same.

In addition, the present disclosure provides a display device that can guarantee higher rigidity thereof while reducing a thickness thereof through a back cover formed of a high-strength composite material as compared to the conventional display device, and a vehicle including the display device.

Technical tasks obtainable from the present disclosure are non-limited by the above-mentioned technical tasks. And other unmentioned technical tasks can be clearly understood from the following description by those having ordinary skill in the technical field to which the present disclosure pertains.

Additional advantages, objects, and features of the disclosure will be set forth in the disclosure herein as well as the accompanying drawings. Such aspects may also be appreciated by those skilled in the art based on the disclosure herein.

To achieve these objects and other advantages and in accordance with the purpose of the disclosure, as embodied and broadly described herein, a display device mounted in a vehicle may include a display panel; a fixing plate configured to surround side and back surfaces of the display panel and formed to have an opening; a printed circuit board connected to the display panel and disposed in the opening; and a back cover configured to cover the fixing plate and the printed circuit board and configured to include a high-strength composite material. The back cover includes a plurality of slits spaced apart from each other in a first direction at a front surface of the back cover.

The width of each of the plurality of slits may become smaller in a second direction perpendicular to the first direction, and the front surface of the back cover may be divided into a multiple portions by the plurality of slits.

The plurality of slits may be formed at both sides of the back cover.

The back cover may include a plurality of screw fastening grooves formed to be spaced apart from each other in the first direction, and the plurality of slits is formed between the plurality of screw fastening grooves.

Each of the plurality of slits may be formed in at least one of "E", "V", or "W" shapes.

Each of the plurality of slits further may include a curved surface protruding forward.

The back cover may include a plurality of locking protrusions formed at a rear surface of the back cover.

In accordance with another aspect of the present disclosure, a vehicle may include a vehicle body; a holder disposed in the vehicle body; and a display device mounted in the holder. The display device includes a display panel; a fixing plate configured to surround side and back surfaces of the display panel and formed to have an opening; a printed circuit board connected to the display panel and disposed in the opening; and a back cover configured to cover the fixing plate and the printed circuit board and configured to include a high-strength composite material. The back cover may include a plurality of slits spaced apart from each other in a first direction at a front surface of the back cover.

The width of each of the plurality of slits may become smaller in a second direction perpendicular to the first direction, and the front surface of the back cover may be divided into a multiple portions by the plurality of slits.

The plurality of slits may be formed at both sides of the back cover.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

DETAILED DESCRIPTION

Description will now be given in detail according to exemplary embodiments disclosed herein, with reference to the accompanying drawings. The same or equivalent components may be provided with the same reference numbers, and description thereof will not be repeated. As used herein, the suffixes "module" and "part" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

As such, the present disclosure should be construed to extend to any alterations, equivalents and substitutes in addition to those which are particularly set out in the accompanying drawings.

Although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, it will be understood that when an element is referred to as being "directly connected with" another element, there are no intervening elements present.

A singular representation may include a plural representation unless it represents a definitely different meaning from the context.

The terms such as "include" or "have" used herein are intended to indicate that features, numbers, steps, operations, elements, components, or combinations thereof used in the following description exist and it should be thus understood that the possibility of existence or addition of one or more different features, numbers, steps, operations, elements, components, or combinations thereof is not excluded.

Figure 1:
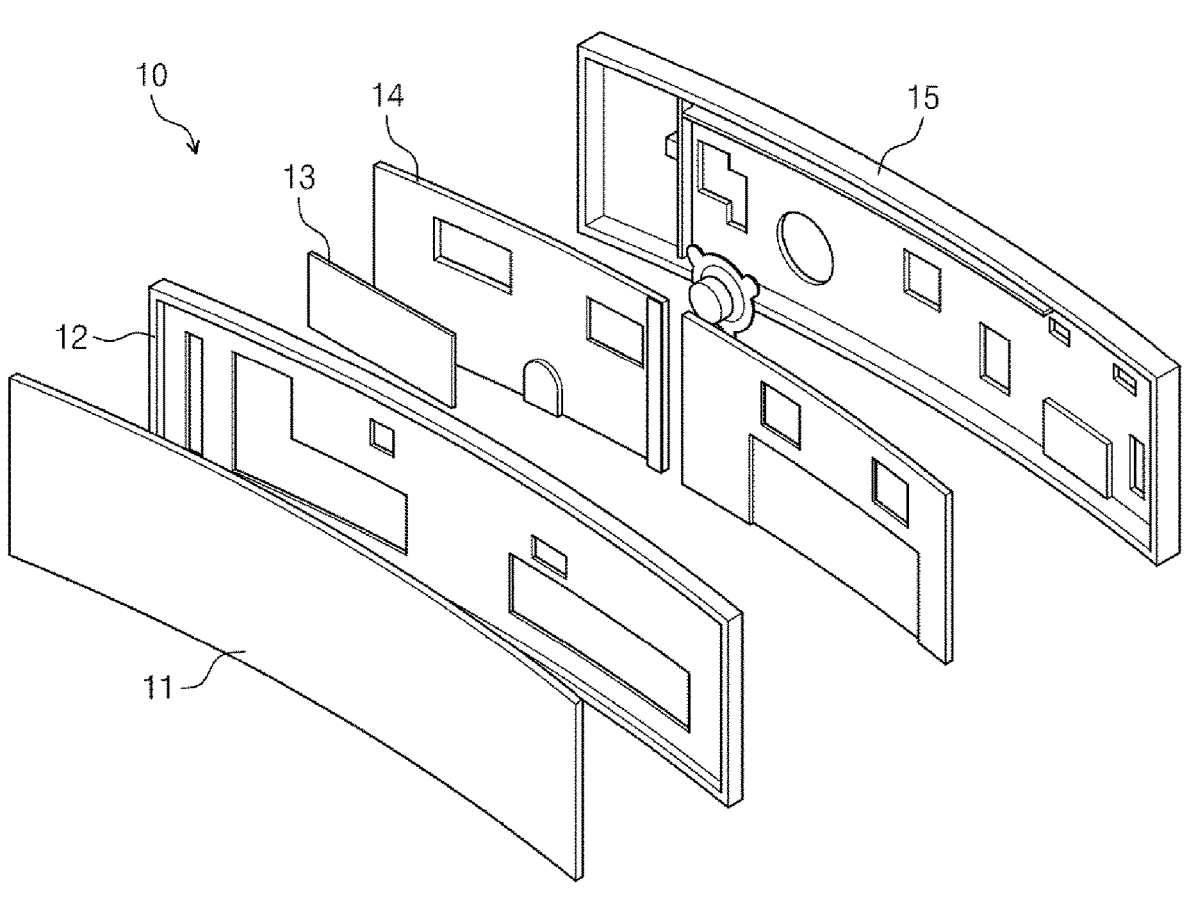
FIG. 1 is an exploded perspective view of a display device that is generally mounted in a vehicle.

FIG. 1 is an exploded perspective view of a display device 10 that is generally mounted in a vehicle.

As shown in FIG. 1, a general display device 10 includes a display panel 11, a panel member 12 surrounding side and rear surfaces of the display panel 11, a printed circuit board (PCB) 13 connected to the display panel 11, a fixing bracket 14 where the printed circuit board 13 is mounted and for mounting the display device 10 to a vehicle, and a back cover 15. In this regard, the fixing bracket 14 maintains a rigidity of the display device 10 mounted in the vehicle, is for shielding and heat dissipation, and is generally made of aluminum. The back cover 15 is generally made of plastic.

Such general display device 10 is fixed to the vehicle via the fixing bracket 14 rather than the back cover 15. Therefore, when an occupant applies an external force to the display device 10, the external force applied to remaining components except the fixing bracket 14 may damage the display device 10. For example, when the occupant stands up while gripping the display device 10 or pulls the display device 10, the remaining components except the fixing bracket 14 fixed to the vehicle may move accordingly, causing the damage to the display device 10.

In addition, as described above, the display device 10 processes a signal via the printed circuit board 13 to display an image. An electronic device emits electromagnetic waves between electronic components mounted on the printed circuit board 13, causing an electromagnetic interference (EMI). The EMI causes malfunction of the electronic device or has a negative impact on a human body. In particular, as an operating frequency of the electronic device increases to be within a range of tens of Mhz to several Ghz, the EMI problems are becoming more serious.

EMI noise refers to noise that causes noise problems resulted from the interference when the electromagnetic wave generated from one electronic circuit, element, or component is transmitted to another circuit, element, or component.

Accordingly, the EMI noise generated by the electronic component mounted on the printed circuit board 13, which is mounted on the aluminum fixing bracket 14, may be transmitted directly to the display panel 11, causing a failure of the display device 10.

In addition, the display device 10 including the fixing bracket 14 is disadvantageous in terms of slimness. Because the display device 10 mounted in the vehicle has recently become larger, the display device 10 including the fixing bracket 14 is disadvantageous in terms of thickness, rigidity, and weight.

Figure 2:
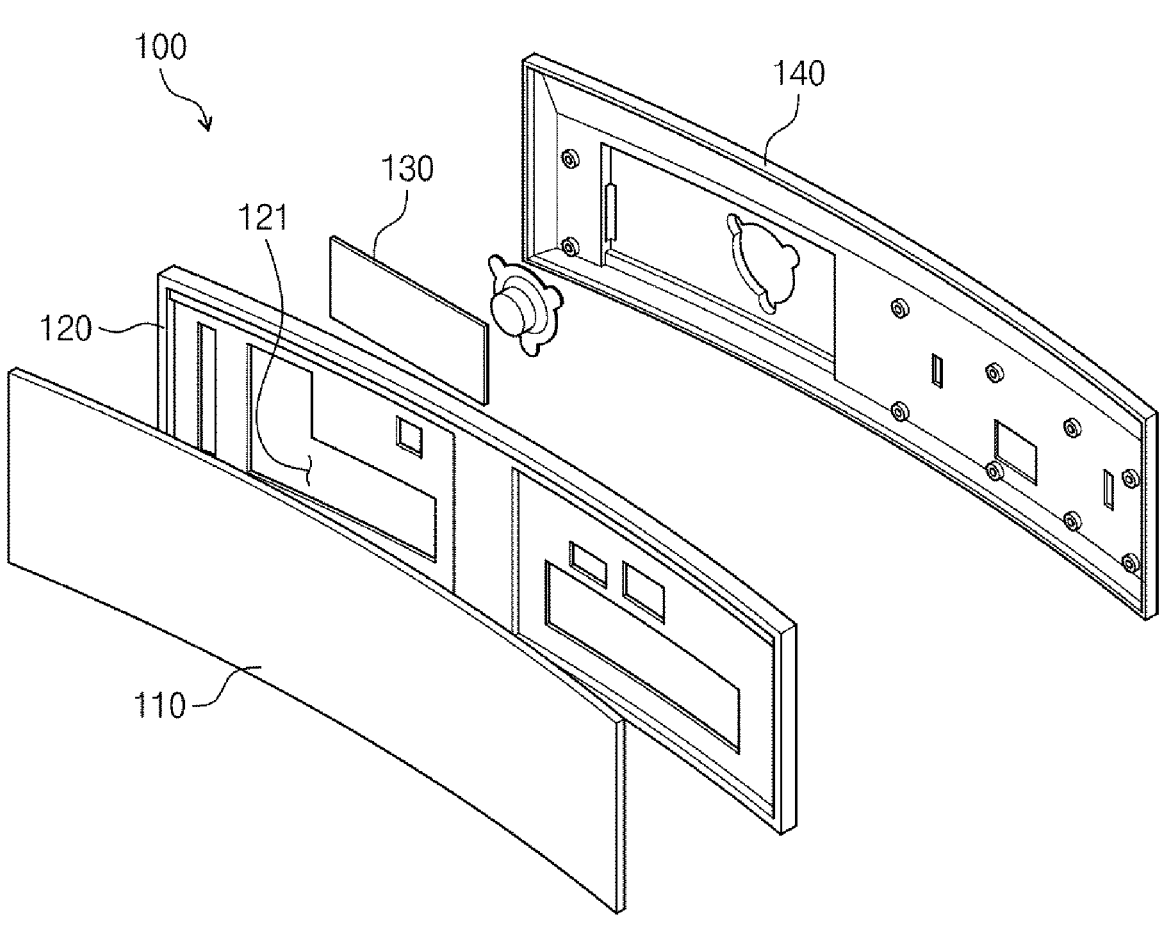
FIG. 2 is an exploded perspective view of a display device according to an embodiment of the present disclosure.

FIG. 2 is an exploded perspective view of a display device 100 according to an embodiment of the present disclosure.

The display device 100 according to one embodiment of the present disclosure may include a display panel 110, a fixing plate 120, a printed circuit board 130, and a back cover 140. In this regard, the fixing plate 120 may surround side and rear surfaces of the display panel 110 and may have an opening 121 defined therein. The opening 121 may expose a portion of the rear surface of the display panel 110. In addition, the printed circuit board 130 may be connected to the display panel 110 and disposed on the portion of the rear surface of the display panel 110 exposed by the opening 121. Additionally, the back cover 140 may cover the fixing plate 120 and the printed circuit board 130 and may contain a conductive material.

That is, unlike the general display device 10 described above with reference to FIG. 1, the display device 100 according to one embodiment of the present disclosure may omit the fixing bracket 14, and the back cover 140 may contain the conductive material rather than the plastic. Accordingly, the EMI noise caused by the electromagnetic waves emitted between the electronic components mounted on the printed circuit board 130 may be reduced, and the thickness may also be reduced compared to that of the existing display device 10. Hereinafter, the display device 100 of the present disclosure will be described in more detail.

Figure 3:
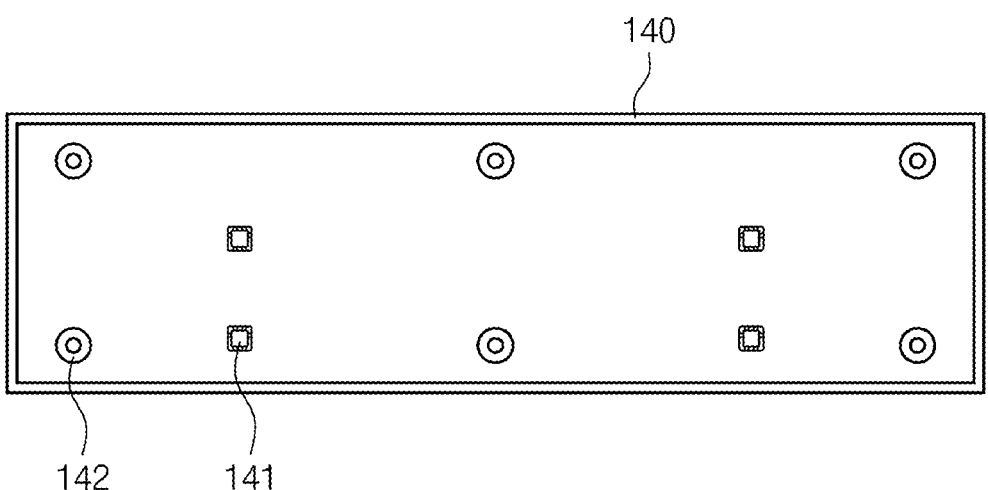
FIG. 3 is a front view of a back cover of a display device according to an embodiment of the present disclosure.
Figure 4:
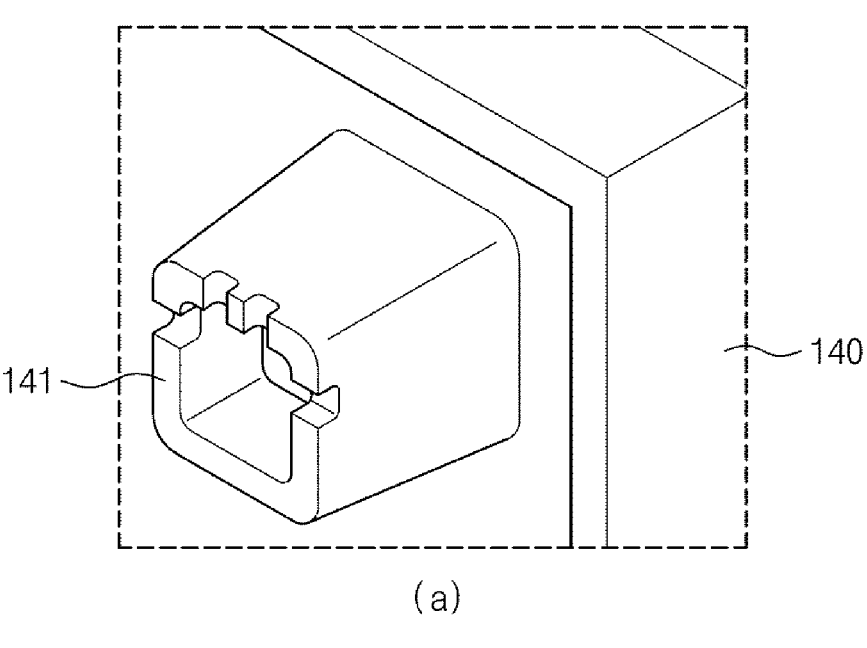
FIG. 4 is a view illustrating a first protrusion in a display device according to an embodiment of the present disclosure.
Figure 4:
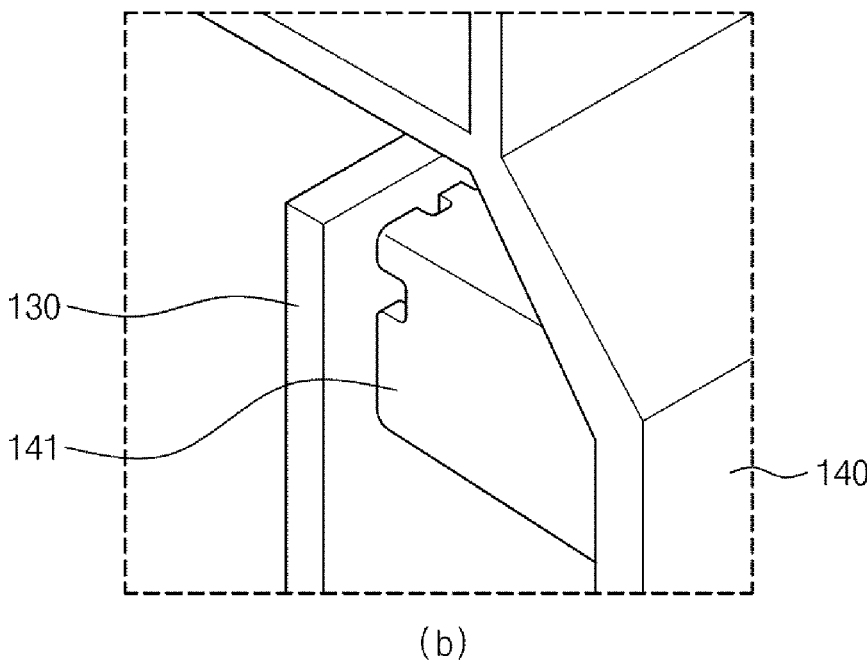
Figure 5:
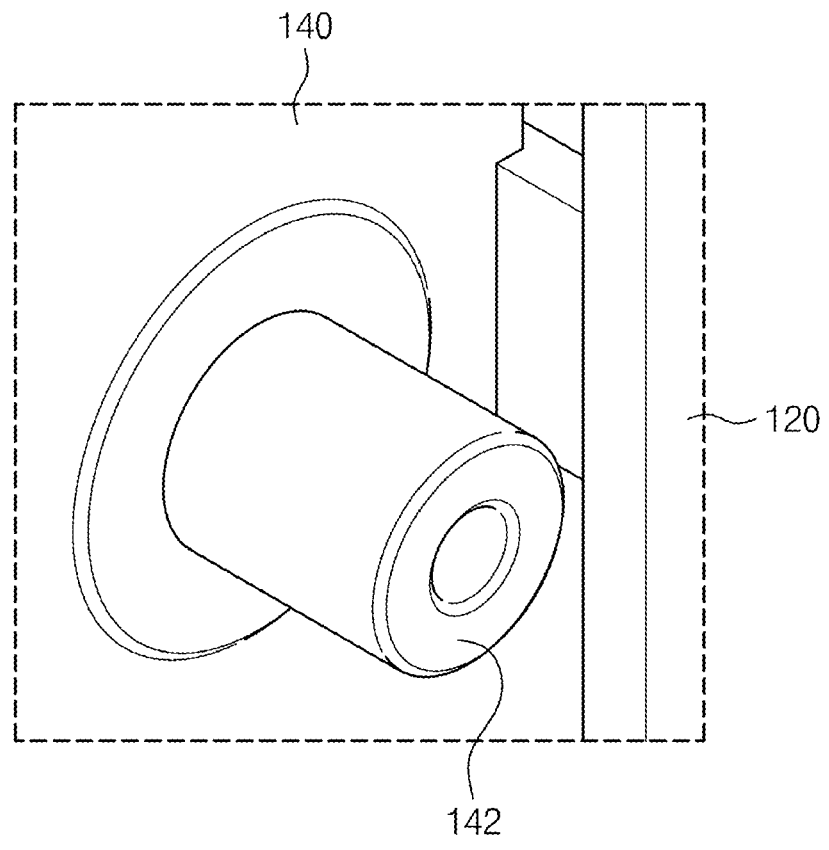
FIG. 5 is a diagram illustrating a second protrusion in a display device according to an embodiment of the present disclosure.
Figure 6:
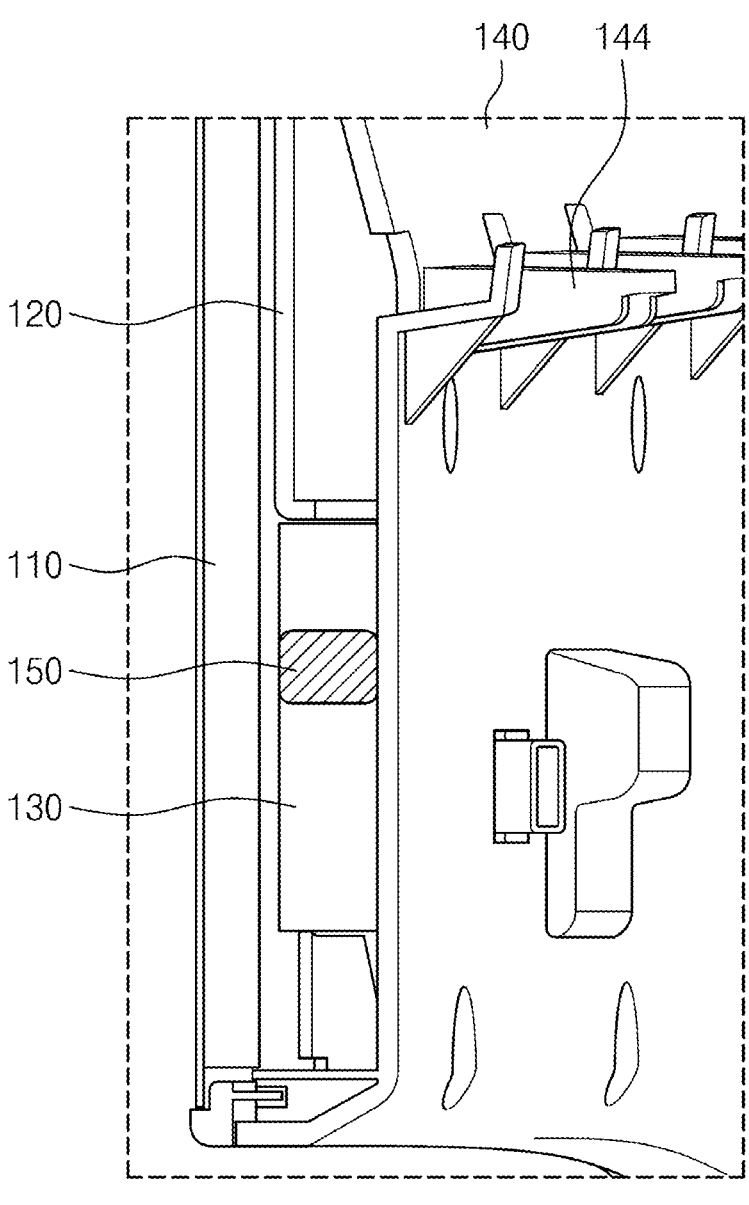
FIG. 6 is a diagram illustrating another embodiment of shielding electromagnetic waves via a display device of the present disclosure.
Figure 7:
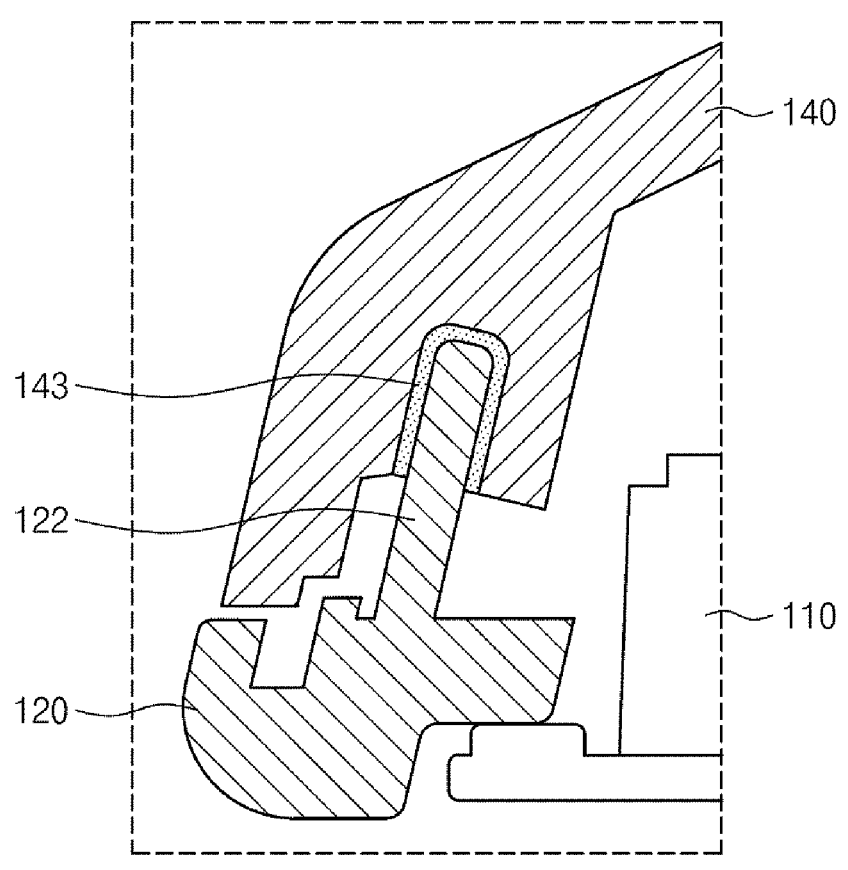
FIG. 7 is a diagram showing a coupling structure of a fixing plate and a back cover in a display device according to an embodiment of the present disclosure.

FIG. 3 is a front view of the back cover 140 of the display device 100 according to an embodiment of the present disclosure. FIG. 4 is a view illustrating a first protrusion 141 in the display device 100 according to an embodiment of the present disclosure. FIG. 5 is a diagram illustrating a second protrusion 142 in the display device 100 according to an embodiment of the present disclosure. FIG. 6 is a diagram illustrating another embodiment of shielding electromagnetic waves via the display device 100 of the present disclosure. In addition, FIG. 7 is a diagram showing a coupling structure of the fixing plate 120 and the back cover 140 in the display device 100 according to an embodiment of the present disclosure.

Referring to FIGS. 3 and 4 together, the display device 100 according to one embodiment of the present disclosure may include the first protrusion 141 in contact with the printed circuit board 130. In this regard, the first protrusion 141 may be in contact with the printed circuit board 130 and serve to fix the printed circuit board 130 connected to the display panel 110. Additionally, the first protrusion 141 may be in contact with the printed circuit board 130 and provide a ground voltage of the printed circuit board 130 to the back cover 140.

That is, the first protrusion 141 may serve to fix the printed circuit board 130 connected to the display panel 110 in the display device 100 of the present disclosure from which the fixing bracket 14 in FIG. 1 is omitted, and at the same time, may be in contact with the printed circuit board 130 and provide the ground voltage of the printed circuit board 130 to the back cover 140, thereby expanding a ground area and reducing the EMI noise.

More specifically, diagram (a) in FIG. 4 shows a shape of the first protrusion 141, and diagram (b) in FIG. 4 shows a shape of the first protrusion 141 in contact with the printed circuit board 130. As shown in diagram (a) in FIG. 4, a lower side of the first protrusion 141 may have a planar shape to be in contact with the printed circuit board 130 and fix the printed circuit board 130, and may act as a barrier to prevent the EMI occurred from the printed circuit board 130 from spreading. Additionally, an upper side of the first protrusion 141 may have a curved shape to expand the ground area by providing the ground voltage of the printed circuit board 130 to the back cover 140.

Accordingly, as shown in diagram (b) in FIG. 4, the first protrusion 141 may be in contact with the printed circuit board 130 and fix the printed circuit board 130 connected to the display panel 110, and at the same time, provide the ground voltage of the printed circuit board to the back cover 140, thereby expanding the ground area and reducing the EMI noise.

FIG. 5 is a diagram illustrating the second protrusion 142 in the display device 100 according to an embodiment of the present disclosure. In the present disclosure, the back cover 140 may include the second protrusion 142, and the second protrusion 142 may be inserted into the fixing plate 120 and spaced apart from the display panel 110.

In other words, the second protrusion 142 may be inserted into the fixing plate 120 to strengthen the coupling structure of the display device 100 in the present disclosure from which the fixing bracket 14 in FIG. 1 is omitted, and at the same time, may be spaced apart from the display panel 110 to prevent the damage to the display device 100 by the external force of the occupant as described above.

In addition, referring to FIGS. 3 to 5 together, in the display device 100 according to one embodiment of the present disclosure, the back cover 140 may include the first protrusion 141 and the second protrusion 142, and the first protrusion 141 may include a plurality of first protrusions spaced apart from each other along a perimeter of the printed circuit board 130. Additionally, the second protrusion 142 may include a plurality of second protrusions spaced apart from each other along a perimeter of the fixing plate 120. In other words, as the plurality of first protrusions 141 and the plurality of second protrusions 142 are formed, the coupling structure of the components of the display device 100 of the present disclosure may be strengthened, and the EMI noise may also be effectively reduced.

FIG. 6 is a diagram illustrating another embodiment of shielding the electromagnetic waves via the display device 100 of the present disclosure. The display device 100 according to one embodiment of the present disclosure may further include a conductive member 150 that shields the electromagnetic waves between the printed circuit board 130 and the back cover 140. Additionally, such conductive member 150 may shield the electromagnetic waves generated between the electronic components mounted on the printed circuit board 130, thereby reducing the EMI noise.

FIG. 7 is a diagram illustrating the coupling structure of the fixing plate 120 and the back cover 140 in the display device 100 according to an embodiment of the present disclosure. In the display device 100 according to one embodiment of the present disclosure, the fixing plate 120 may include ribs 122 that protrude toward the back cover 140 at both sides of a rear surface thereof. Additionally, the back cover 140 may include each coupling groove 143 into which each rib 122 is inserted.

In the case of the general display device 10 shown in FIG. 1, the panel member 12 and the back cover 15 generally include a hook-shaped locking member and are coupled to each other via the locking member. However, in this case, when the occupant applies the external force to the display panel 11 to manipulate the display device 10, light leakage may occur as a gap occurs between the display panel 11 and the panel member 12 because of weak support against the external force.

Therefore, in the display device 100 according to one embodiment of the present disclosure, as shown in FIG. 7, the rib 122 formed on the fixing plate 120 is inserted into the coupling groove 143 of the back cover 140, so that the back cover 140 may stably support the display device 100 even when the occupant applies the external force to the display panel 110, and thus, solve the problems such as the light leakage described above.

Additionally, referring to FIG. 6, the back cover 140 in the display device 100 according to one embodiment of the present disclosure may contain a high-strength composite material. In addition, the back cover 140 may include a plurality of hooking protrusions 144 formed on the rear surface thereof.

This is because the display device 10 may be damaged by the external force applied to the remaining components except the fixing bracket 14 when the occupant applies the external force to the display device 10 as the general display device 10 shown in FIG. 1 is fixed to the vehicle via the fixing bracket 14.

On the other hand, because the display device 100 according to one embodiment of the present disclosure omits the fixing bracket 14 in FIG. 1 and has a structure in which the hooking protrusions 144 of the back cover 140 containing the high-strength composite material with rigidity greater than that of the plastic material are directly fixed to the vehicle, the problem of damage caused by the external force applied to the display device 100 described above may be solved.

Figure 8:
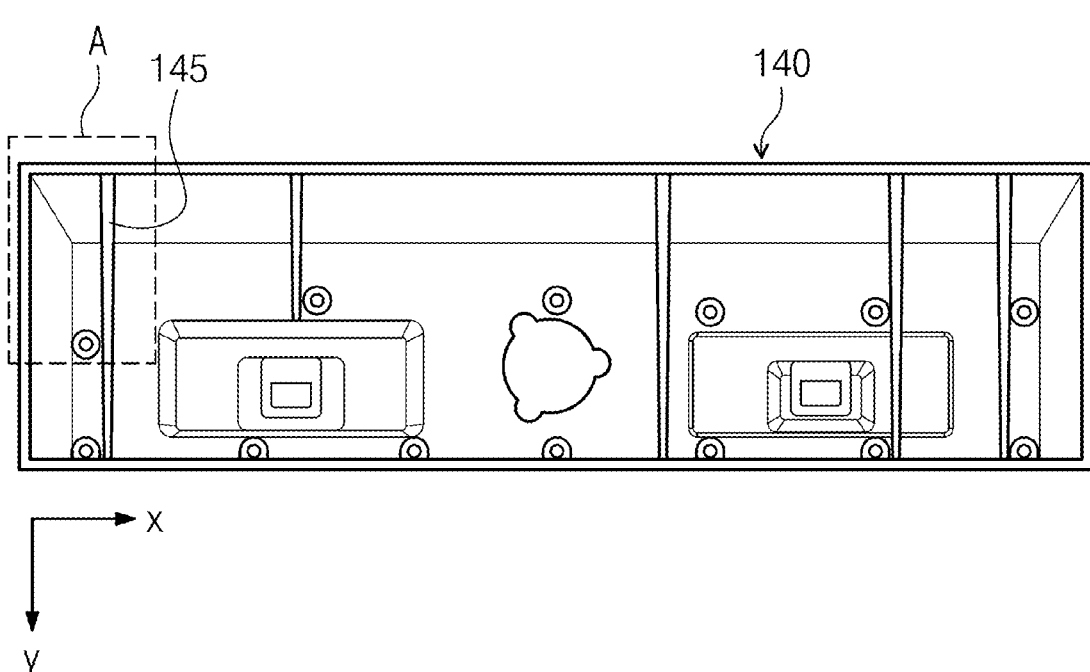
FIG. 8 is a view illustrating a plurality of slits formed in the back cover in the display device according to an embodiment of the present disclosure.
Figure 9:
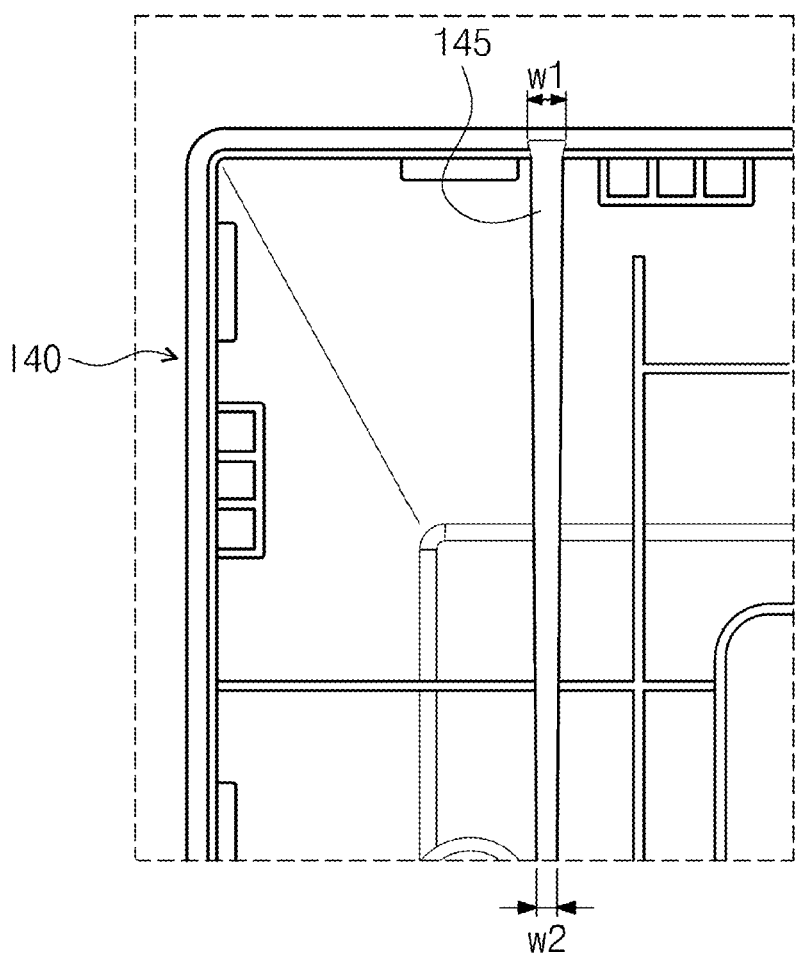
FIG. 9 is an enlarged view illustrating a region "A" of FIG. 8.

FIG. 8 is a view illustrating a plurality of slits 145 formed in the back cover 140 in the display device 100 according to an embodiment of the present disclosure. FIG. 9 is an enlarged view illustrating the region "A" of FIG. 8.

In the display device 100 according to the embodiment of the present disclosure, the back cover 140 including a high-strength composite material may include a plurality of slits 145 formed at the front surface thereof. Here, the plurality of slits 145 may be spaced apart from each other in a first direction (X-axis direction).

As described above, while omitting the configuration of the fixing bracket 14 of FIG. 1, the back cover 140 is made of a high-strength composite material with more excellent rigidity than a plastic material can be formed by injection molding.

However, due to characteristics of injection molding, bending caused by deformation of the back cover occurs during cooling, and thus an error may occur in coupling dimensions when combining the display device 100. Even when the display device 100 is coupled to the back cover that is not deformed, the back cover 140 may be deformed due to external force applied to the display device 100 thereafter. As a result, a gap may occur in a coupling portion of the display device 100, so that light leakage may occur and damage to the display device 100 may also occur.

Accordingly, the display device 100 according to the embodiment of the present disclosure can solve the above-mentioned problem by forming a plurality of slits 145 in the back cover 140.

The display device 100 according to the embodiment of the present disclosure may be elongated in a first direction (X-axis direction) corresponding to a longitudinal direction. Accordingly, the plurality of slits 145 may be formed at the front surface of the back cover 140 to be spaced apart from each other in the first direction (X-axis direction), thereby effectively preventing the back cover 140 from being bent due to such deformation.

Here, referring to FIGS. 8 and 9, in the display device 100 according to the embodiment of the present disclosure, the width of each of the plurality of slits 145 becomes smaller (i.e., tapered) in the second direction (Y-axis direction) perpendicular to the first direction (X-axis direction), and the front surface of the back cover 140 can be divided into multiple parts by the plurality of slits 145. That is, the width (w2) of FIG. 9 may be smaller than the width (w1).

Referring to FIGS. 2 and 3, since the printed circuit board 130 is disposed below the display panel 110, the back cover 140 covering the printed circuit board 130 may have a convex side shape that becomes more convex in the direction from the upper side to the second direction (Y-axis direction). Accordingly, the back cover 140 may be more vulnerable to bending caused by deformation as the back cover 140 moves upward.

Therefore, in order to more effectively prevent deformation of the back cover 140, the display device 100 may enable the width of the slit 145 at the upper side of the back cover 140 to be larger than the width of the slit 145 at the lower side of the back cover 140.

Figure 10:
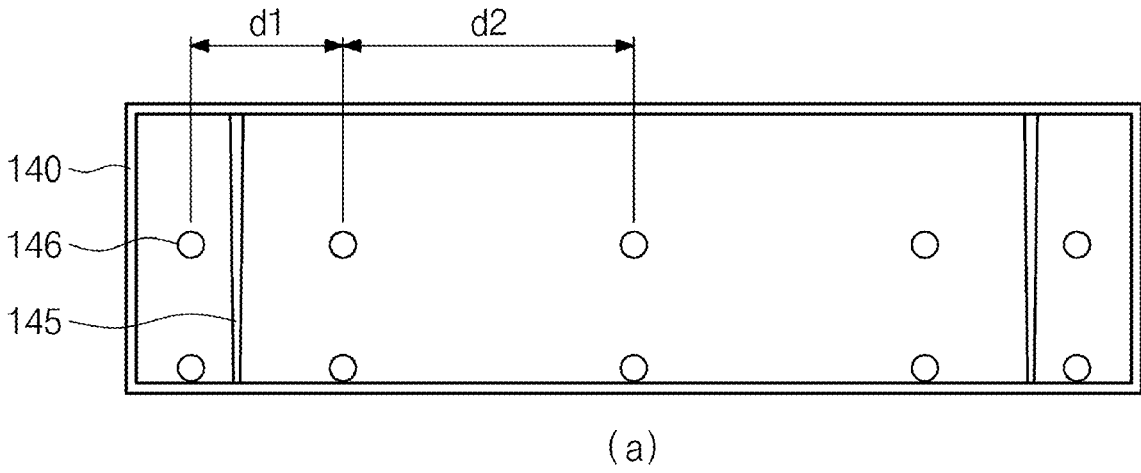
FIG. 10 is a view illustrating a plurality of slits formed between a plurality of screw fastening grooves in the display device according to an embodiment of the present disclosure.
Figure 10:
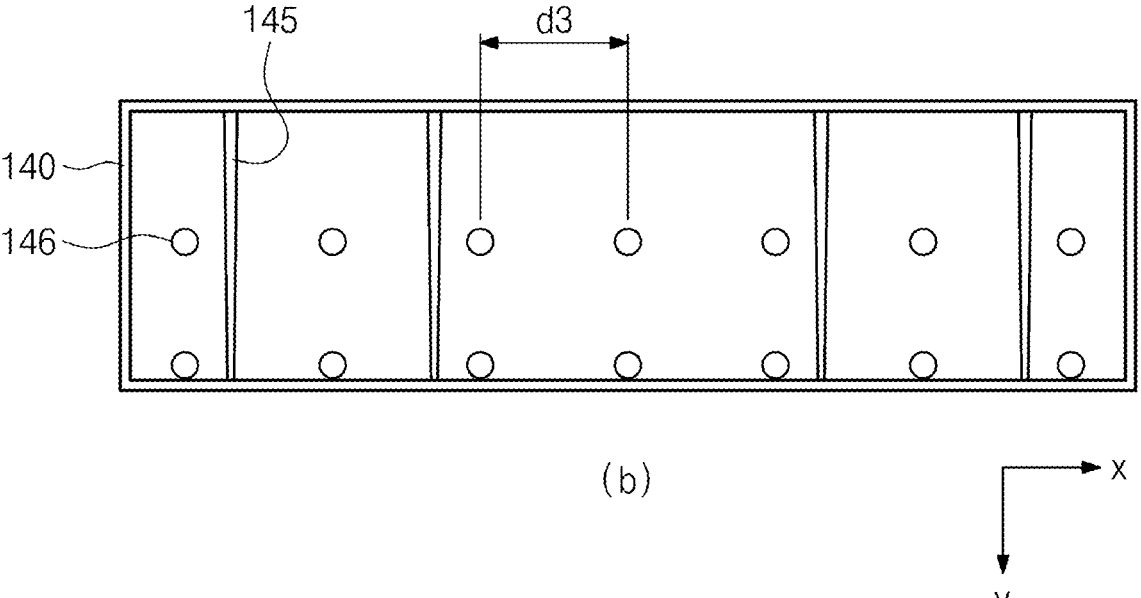

FIG. 10 is a view illustrating the plurality of slits 145 formed between a plurality of screw fastening grooves 146 for use in the display device 100 according to an embodiment of the present disclosure.

Referring to FIG. 10, the back cover 140 of the display device 100 may include a plurality of screw fastening grooves 146 formed to be spaced apart from each other in the first direction (X-axis direction). The back cover 140 can be fixed to the fixing plate 120 shown in FIG. 2 by fastening screws through the plurality of screw fastening grooves 146.

Here, the spacing between the plurality of screw fastening grooves 146 spaced apart from each other in the first direction (X-axis direction) may vary depending on whether the display device 100 is a flat type or a curved type.

For example, diagram (a) of FIG. 10 shows a back cover 140 to be applied to a curved-type display device, and diagram (b) of FIG. 10 shows a back cover 140 to be applied to a flat-type display device. At this time, the back cover 140 to be applied to the curved-type display device may be more vulnerable to bending caused by deformation with decreasing distance from both ends thereof instead of the center portion thereof due to curvature.

Therefore, the spacing (d1) between the screw fastening grooves 146 at both sides of the back cover 140 may be smaller than the spacing (d2) between the screw fastening grooves 146 at the center of the back cover 140. In the case of the back cover 140 to be applied to the flat type, the spacing (d3) between the screw fastening grooves 146 may be the same.

Preferably, the plurality of slits 145 for use in the display device 100 according to the embodiments of the present disclosure may be essentially formed at both sides of the back cover 140 as shown in diagrams (a) and (b) of FIGS. 10.

The reason why the slits 145 are formed as shown in diagrams (a) and (b) of FIG. 10 is to consider not only the appearance quality of the display device 100 that can be directly felt by occupants (or passengers) of the vehicle, but also the possibility that the display device may be more vulnerable to bending caused by deformation of the back cover 140 having a higher degree of deformation in the direction from the center point to both sides of the back cover 140. Furthermore, as shown in diagram (b) of FIG. 10, the plurality of slits 145 may be additionally formed between the plurality of screw fastening grooves 146, such that the slits 145 may effectively correspond to extension of the display device 100 extending in the first direction (X-axis direction) of the display device 100, thereby preventing bending caused by deformation of the back cover 140.

Figure 11:
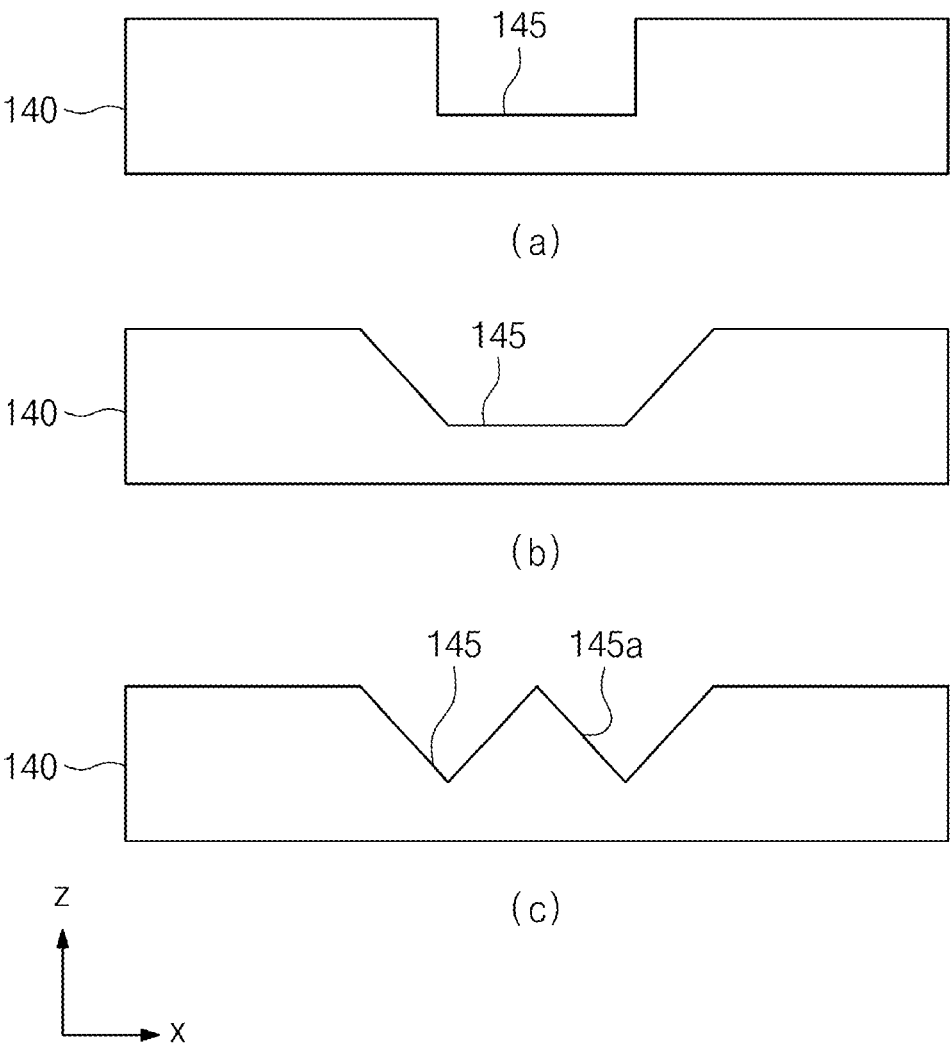
FIG. 11 is a view illustrating various shapes of slits formed in the back cover in the display device according to an embodiment of the present disclosure.

FIG. 11 is a view illustrating various shapes of the slits 145 formed in the back cover 140 in the display device 100 according to an embodiment of the present disclosure.

In the display device 100 according to the embodiment of the present disclosure, the slit 145 formed in the back cover 140 may include at least one of "E", "V", and "W" shapes.

FIG. 11 is a diagram illustrating a cross-sectional shape viewed from the top of the back cover 140. In more detail, diagram (a) of FIG. 11 shows the "C"-shaped slit 145, diagram (b) of FIG. 11 shows the "V"-shaped slit 145, and diagram (c) of FIG. 11 shows the "W"-shaped slit 145.

The reason why the structures of diagrams (a), (b) and (c) of FIG. 11 are configured is to apply various shapes of slits 145 to the back cover 140 in response to various materials of the back cover 140 including a high-strength composite material or various shapes of the display device 100.

For example, the L-shaped slit 145 of diagram (a) of FIG. 11 can be most commonly applied in light of simplification of a mold structure for injection molding of the back cover 140. In addition, when molten resin for injection molding is injected through the V-shaped slit 145 of FIG. (b) of FIG. 11 and the W-shaped slit 145 of diagram (c) of FIG. 11, the flowability of the molten resin can be improved, thereby improving the quality of the injection molded back cover.

In particular, the slit 145 of the display device 100 may further include a bent surface 145a protruding forward (Z-axis direction). For example, when the slit 145 includes a bent surface 145a as shown in diagram (c) of FIG. 11, despite external force applied to the display device 100 by the occupant (or passenger) of the vehicle, the rigidity of the back cover 140 can be well maintained. As a result, the above-described slit structure can more effectively prevent damage to the display device 100.

In addition, referring to FIGS. 8 to 10, the upper side of the back cover 140 visible to eyes of the occupant may be configured such that the slit 145 is formed to occupy a predetermined area in the thickness direction (Z-axis direction) of the back cover 140 as shown in FIG. 11. Additionally, the lower side of the back cover 140 is invisible to the eyes of the occupant may also be formed such that the slit 145 can penetrate the back cover 140 in the thickness direction (Z-axis direction) of the back cover 140. As a result, the above-described structures may be advantageous in securing the rigidity of the back cover 140 while considering aspects of the appearance quality of the display device 100 that can be directly felt by vehicle occupants.

Summarizing the above, the display device and the vehicle including the same according to the embodiments of the present disclosure may form a plurality of slits in the back cover made of a high-strength composite material to prevent bending caused by deformation of the back cover, thereby preventing light leakage. In addition, the display device may be formed to have a smaller thickness through the back cover made of a high-strength composite material as compared to the conventional display device, thereby guaranteeing the rigidity of the back cover.

As is apparent from the above description, the display device according to the embodiments of the present disclosure may form a plurality of slits in the back cover formed of a high-strength composite material, may prevent bending caused by deformation of the back cover, and may thus block light leakage.

In addition, the display device according to the embodiments of the present disclosure can reduce a thickness thereof through a back cover formed of a high-strength composite material while guaranteeing higher rigidity thereof as compared to the conventional display device.

The above detailed description is to be construed in all aspects as illustrative and not restrictive. The scope of the present disclosure should be determined by reasonable interpretation of the appended claims and all changes coming within the equivalency range of the present disclosure are intended to be embraced in the scope of the present disclosure.

What is claimed is:

1. A display device of a vehicle, comprising:
   a display panel having a plurality of surfaces including side and back surfaces;
   a fixing plate covering the side and back surfaces of the display panel and having an opening exposing a portion of the back surface of the display panel;
   a printed circuit board (PCB) disposed on the portion of the back surface of the display panel exposed by the opening; and
   a back cover formed of a high-strength composite material, covering the fixing plate and the PCB, and including front surface having a plurality of slits spaced apart from each other in a first direction;
   wherein each of the plurality of slits is tapered in a second direction perpendicular to the first direction.

2. The display device according to claim 1, wherein the plurality of slits divides the front surface of the back cover into a plurality of segments.

3. The display device according to claim 2, wherein the plurality of slits includes first and second slits respectively at mutually opposite end portions of the back cover.

4. The display device according to claim 1, wherein:
   the back cover includes a plurality of screw fastening grooves spaced apart from each other in the first direction; and
   the plurality of slits is between the plurality of screw fastening grooves.

5. The display device according to claim 1, wherein the back cover includes a rear surface having a plurality of locking protrusions.

6. The display device according to claim 1, wherein each of the plurality of the slits has a cross-sectional shape that is one of "⊂", "V" and "W" shapes.

7. A display device of a vehicle, comprising:
   a display panel having a plurality of surfaces including side and back surfaces;
   a fixing plate covering the side and back surfaces of the display panel and having an opening exposing a portion of the back surface of the display panel;
   a printed circuit board (PCB) disposed on the portion of the back surface of the display panel exposed by the opening; and
   a back cover formed of a high-strength composite material, covering the fixing plate and the PCB, and including front surface having a plurality of slits spaced apart from each other in a first direction;
   wherein each of the plurality of the slits has one of a "V" shape and a "W" shape in cross-section;

wherein a surface of each slit is curved and protruding forward.

8. A vehicle comprising:

a vehicle body;

a holder disposed in the vehicle body; and a display device mounted to the vehicle by the holder, wherein the display device includes:

a display panel having a plurality of surfaces including side and back surfaces;

a fixing plate covering the side and back surfaces of the display panel and having an opening exposing a portion of the back surface of the display panel;

a printed circuit board (PCB) disposed on a portion of the back surface of the display panel exposed by the opening; and a back cover formed of a high-strength composite material, covering the fixing plate and the PCB, and including a front surface having a plurality of slits spaced apart from each other in a first direction;

wherein each of the plurality of slits is tapered in a second direction perpendicular to the first direction.

9. The vehicle according to claim 8, wherein:

the plurality of slits divides the front surface of the back cover into a plurality of segments.

10. The vehicle according to claim 9, wherein the plurality of slits includes first and second slits respectively at mutually opposite end portions of the back cover.

\* \* \* \* \*